(12) United States Patent
Liaw

(10) Patent No.: US 7,419,898 B2
(45) Date of Patent: Sep. 2, 2008

(54) METHOD FOR METAL GATE STRUCTURE FOR MOS DEVICES

(75) Inventor: Jhon-Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 22 days.

(21) Appl. No.: 11/351,876

(22) Filed: Feb. 10, 2006

(65) Prior Publication Data

US 2006/0125051 A1 Jun. 15, 2006

Related U.S. Application Data

(62) Division of application No. 10/927,943, filed on Aug. 27, 2004, now Pat. No. 7,026,689.

(51) Int. Cl.
H01L 21/4763 (2006.01)

(52) U.S. Cl. .............................. 438/618; 257/E21.168

(58) Field of Classification Search ................ 438/618; 257/E21.168, E21.2, E21.205
See application file for complete search history.

(56) References Cited

U.S. PATENT DOCUMENTS

| | | | |
|---|---|---|---|
| 4,641,417 A | 2/1987 | McDavid | |
| 5,268,330 A * | 12/1993 | Givens et al. | 438/586 |
| 5,923,988 A | 7/1999 | Cheng et al. | |
| 6,004,853 A | 12/1999 | Yang et al. | |
| 6,049,114 A | 4/2000 | Maiti et al. | |
| 6,190,996 B1 | 2/2001 | Mouli et al. | |
| 6,197,641 B1 | 3/2001 | Hergenrother et al. | |
| 6,232,164 B1 * | 5/2001 | Tsai et al. | 438/217 |
| 6,403,996 B1 | 6/2002 | Lee | |
| 6,448,140 B1 | 9/2002 | Liaw | |
| 6,455,383 B1 | 9/2002 | Wu | |
| 6,465,310 B2 | 10/2002 | Lee et al. | |
| 6,475,885 B1 | 11/2002 | Sultan | |
| 6,555,880 B2 * | 4/2003 | Cabral et al. | 257/384 |
| 6,908,806 B2 | 6/2005 | Yang et al. | |
| 7,115,959 B2 * | 10/2006 | Andreoni et al. | 257/410 |
| 2002/0109171 A1 | 8/2002 | Lee | |

* cited by examiner

Primary Examiner—W. David Coleman
(74) Attorney, Agent, or Firm—Duane Morris LLP

(57) ABSTRACT

A method for forming a gate structure includes forming a gate dielectric layer on a semiconductor substrate and a metal gate conductor on the gate dielectric layer. A cap layer is formed on the metal gate conductor. The method provides for patterning the cap layer, the gate metal layer and the gate dielectric layer to form a capped gate conductor. At least one spacer is formed to cover sidewalls of the metal gate conductor and the cap layer, such that the cap layer and the spacer encloses the metal gate conductor layer therein. At least one self-aligned contact structure formed next to the metal gate conductor on the semiconductor substrate. As such, the cap layer and the spacer separate the self-aligned contact structure from directly contacting the metal gate conductor.

14 Claims, 5 Drawing Sheets

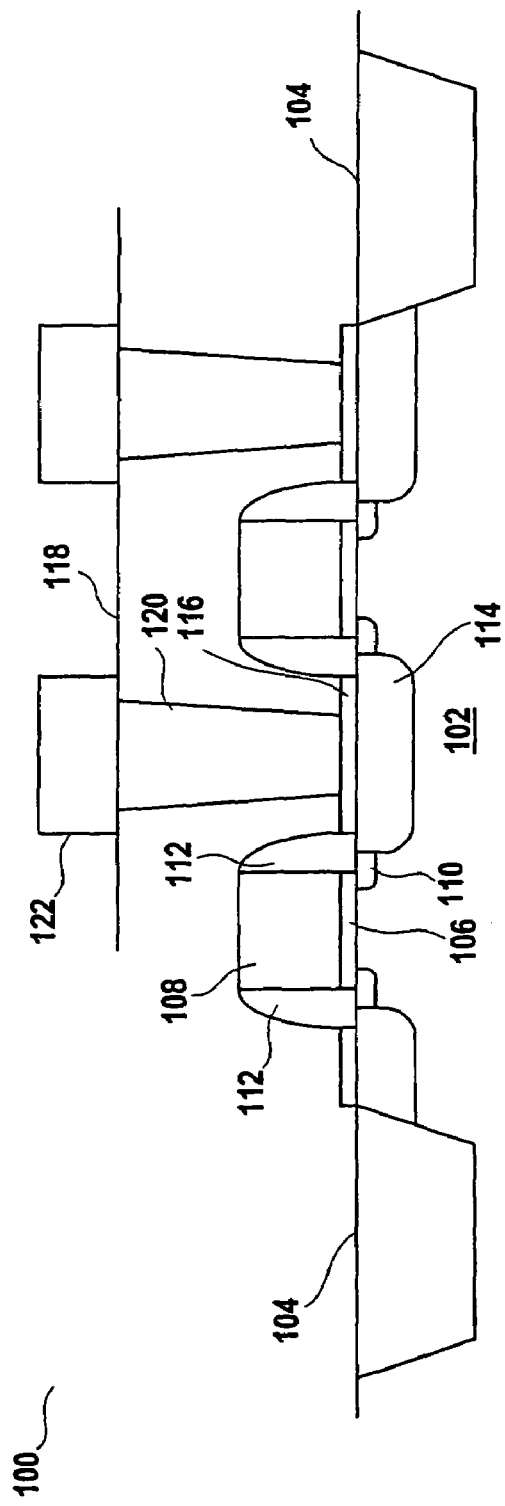
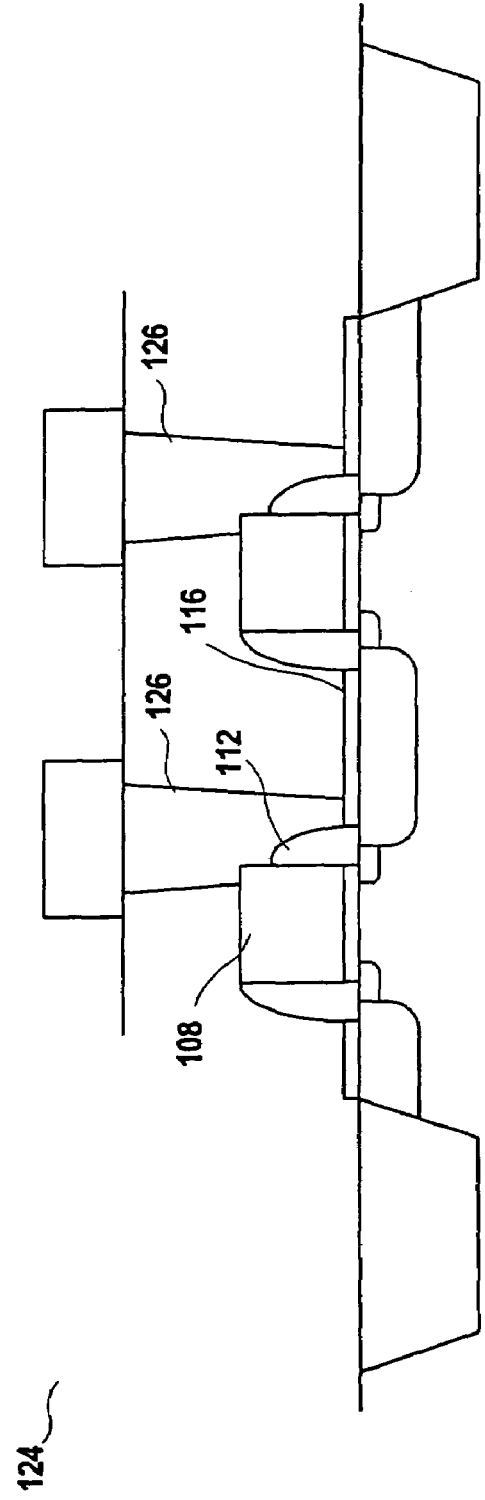
FIG. 1A (Prior Art)
FIG. 1B (Prior Art)

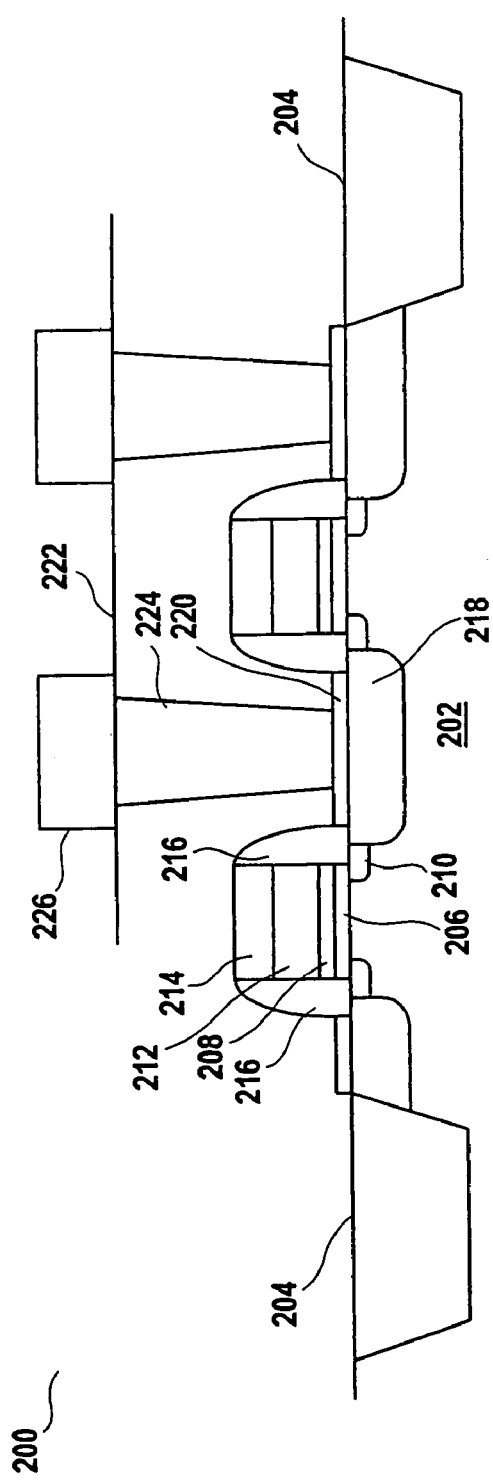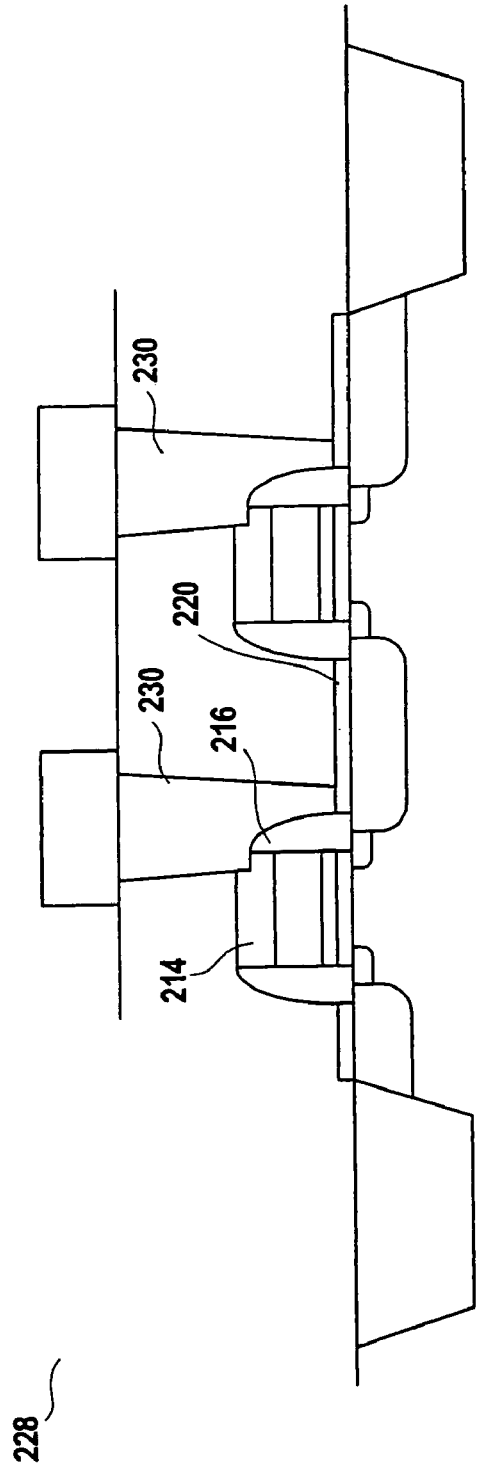

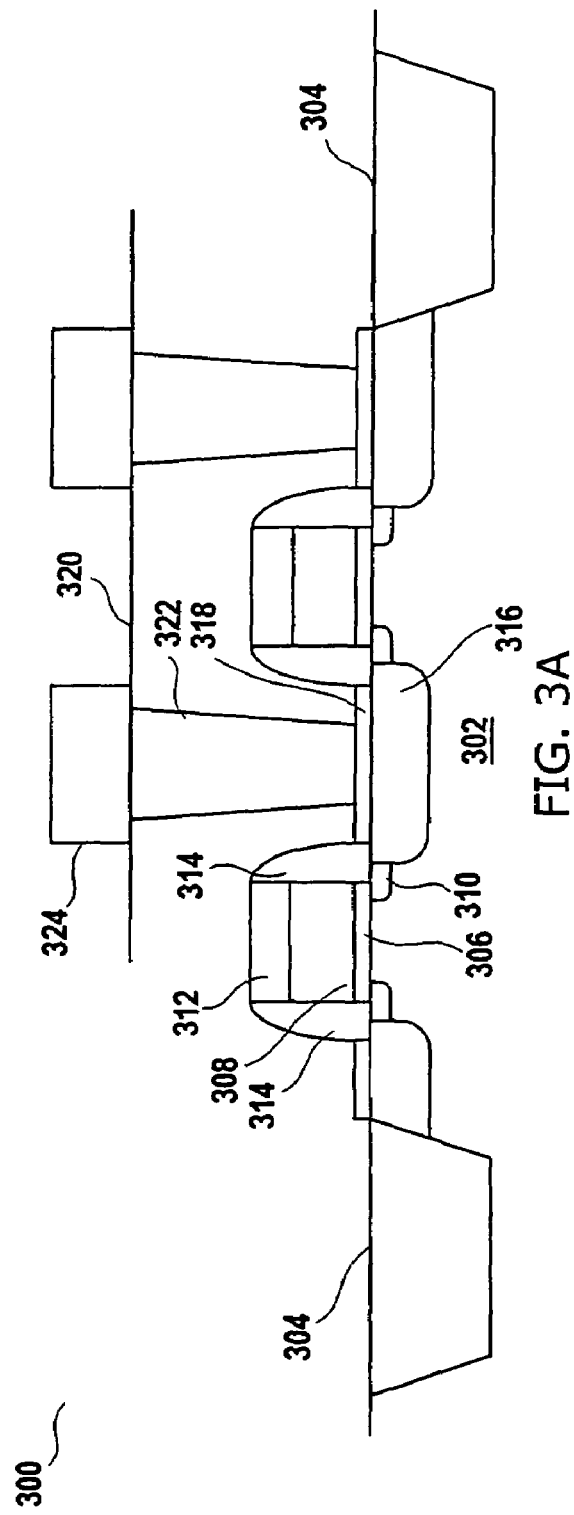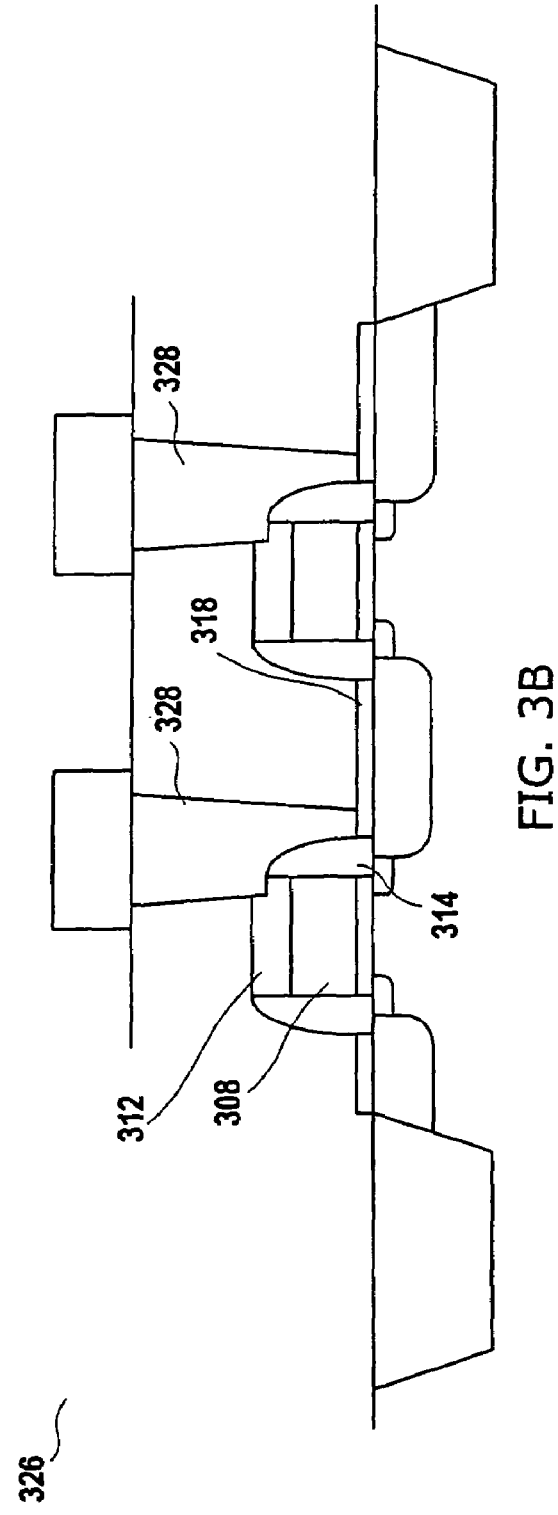

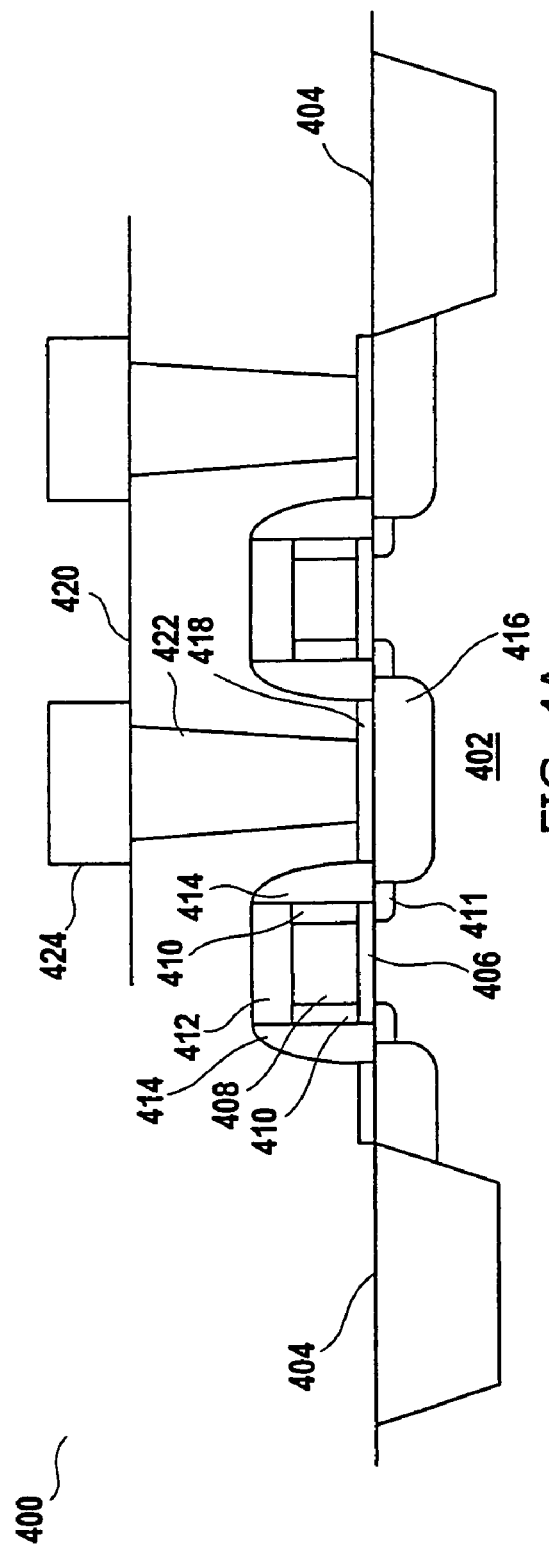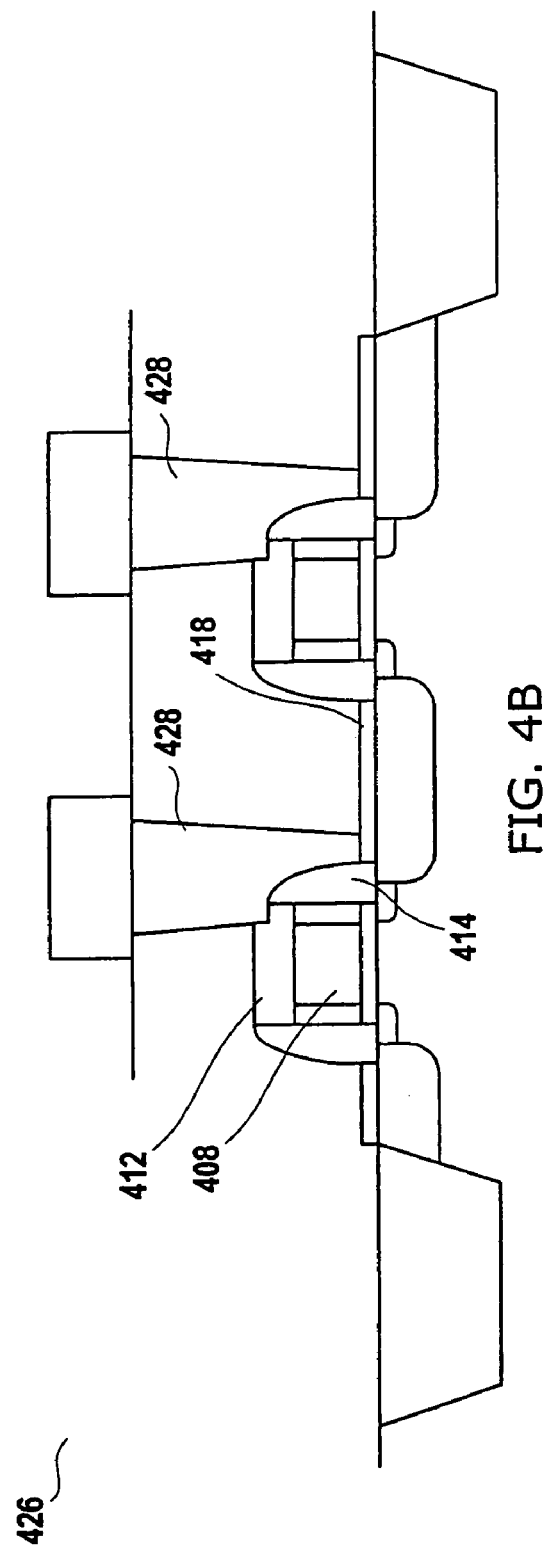

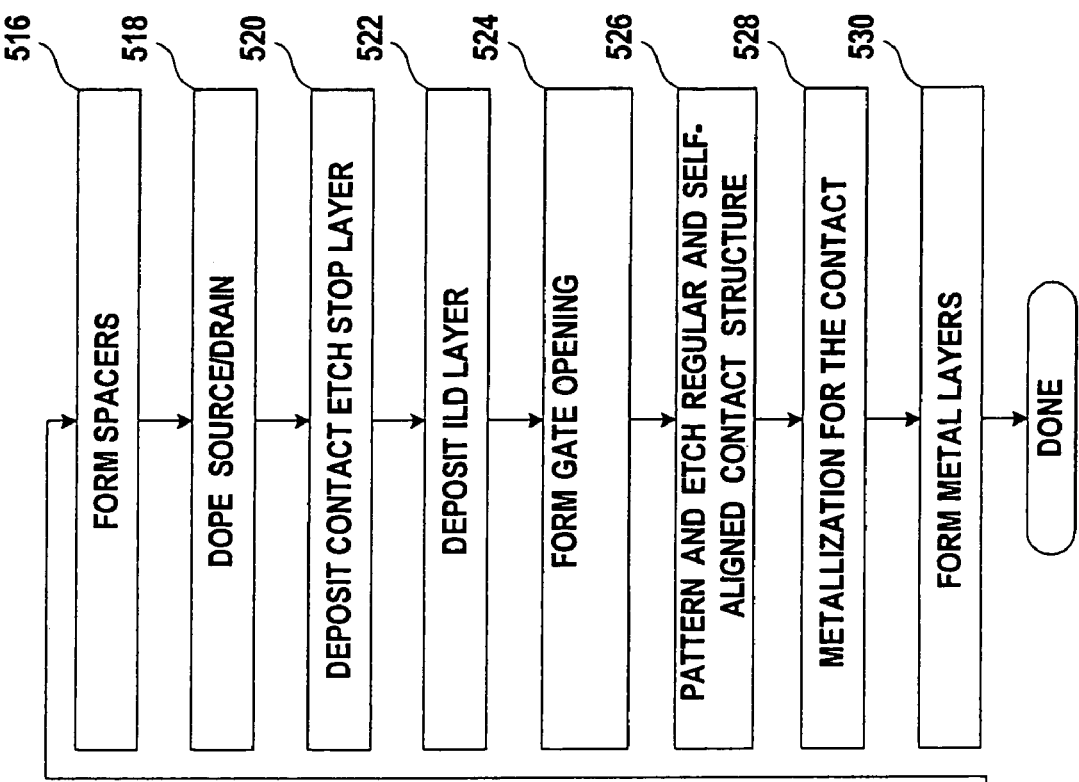
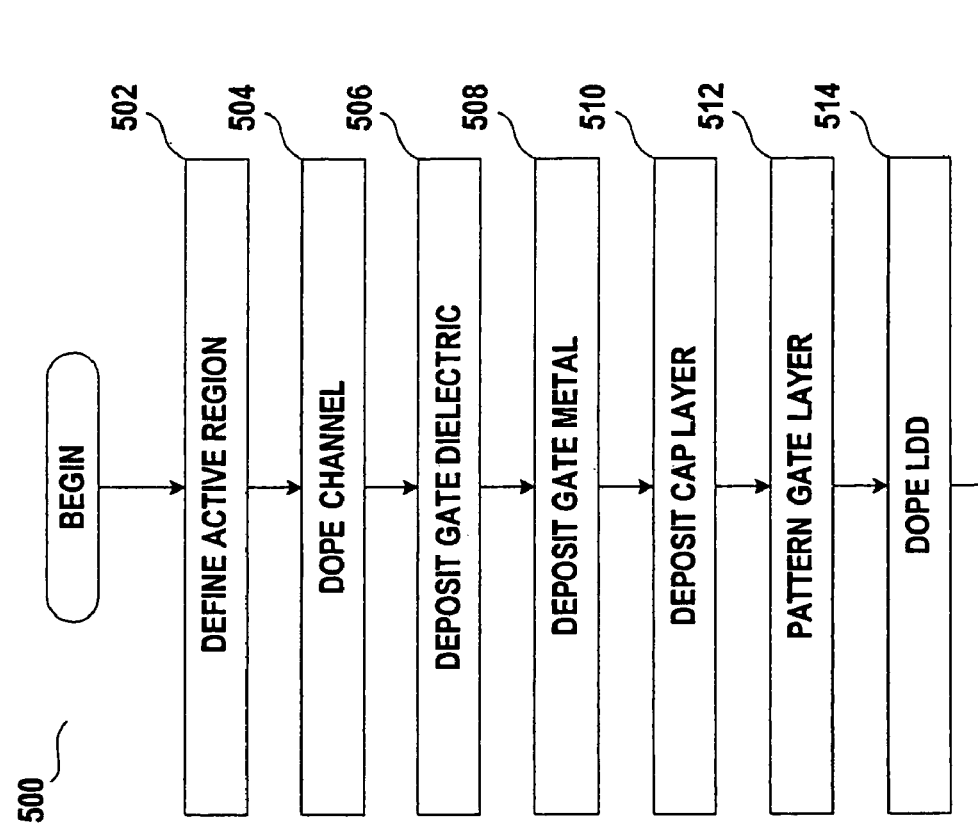
FIG. 5

METHOD FOR METAL GATE STRUCTURE FOR MOS DEVICES

RELATED APPLICATIONS

This is a divisional application of allowed U.S. application Ser. No. 10/927,943 filed Aug. 27, 2004 now U.S. Pat No. 7,026,689.

BACKGROUND

The present invention relates generally to integrated circuit (IC) designs, and more particularly to a method for forming a metal oxide semiconductor (MOS) device with a metal gate and a cap layer.

Conventionally, the gate conductor of a semiconductor device, such as a complementary metal-oxide-semiconductor (CMOS) transistor, is made of polycrystalline silicon doped with either N-type or P-type impurities. While such doped impurities reduce the resistance of the poly-silicon gate conductor, they have undesired electrical characteristics. The doped poly-silicon gate conductor would induce an undesired depletion region thereunder in a substrate. As the size of a semiconductor device keeps shrinking, this undesired depletion region may significantly hinder the improvement of its performance. Thus, it is desirable to replace the conventional poly-silicon gate conductor with other materials that do not require impurity doping, in order to avoid this depletion problem.

Another challenge facing the poly-silicon gate is its low quality electrical interface with a metal contact. To meet this challenge, a silicide layer is formed atop the poly-silicon gate conductor as its interface with the metal contact to reduce resistance thereacross. The silicide layer can be formed by a series of process steps, called self-aligned silicide (salicide) technology, that eliminates a photolithography step, and provides a near perfect alignment for the silicide layer and the poly-silicon gate conductor. This is a significant advantage because, otherwise, the photolithography step will impose a dimension limit on designs of semiconductor device, due to its pattern resolution. Needless to say, the photolithography step costs extra overhead.

Given the superiority of the self-aligned process, it is also desirable to form a self-aligned contact atop a source/drain region. However, the salicide technology for the poly-silicon gate conductor is often not compatible with the process steps for forming the self-aligned contact. When forming the self-aligned contact, a metal layer is deposited over the source/drain regions, thermally treated, and then etched back. In order to avoid an undesired electrical connection between the gate conductor and the source/drain regions through the self-aligned contact, a cap layer is usually formed atop the gate conductor as a protection layer. Because of this cap layer, the salicide layer and the self-aligned contact cannot be formed in the same process steps.

What is needed is MOS device with a gate structure of a non-ploy-silicon material, which eliminates the need of a salicide layer, such that the self-aligned contact may be implemented in a simplified fabrication process.

SUMMARY

The present invention discloses a gate structure for MOS devices. In one embodiment, the gate structure includes a gate dielectric layer disposed on a semiconductor substrate, a metal gate conductor disposed on the gate dielectric layer, a cap layer disposed on the metal gate conductor, at least one spacer covering sidewalls of the metal gate conductor and the cap layer, such that the cap layer and the spacer encloses the metal gate conductor layer therein, and at least one self-aligned contact structure formed next to the metal gate conductor on the semiconductor substrate. As such, the cap layer and the spacer separate the self-aligned contact structure from directly contacting the metal gate conductor.

The gate structure is formed by depositing a gate dielectric layer on a substrate, depositing a gate metal layer atop the gate dielectric layer, depositing a cap layer atop the gate metal layer and patterning the cap layer, the gate metal layer and the gate dielectric layer to form a capped gate conductor. One or more spacers are formed covering sidewalls of the capped gate conductor, including a stack of the patterned cap layer and gate metal layer. An inter-level dielectric layer is formed over the capped gate conductor, the spacers and the substrate, a contact opening is formed in the inter-level dielectric layer exposing a portion of a top surface of the substrate adjacent to the spacers, and a contact structure is formed within the contact opening. The spacers and the cap layer separate the contact structure from the patterned gate metal layer enclosed therein.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A-1B illustrate a conventional MOS device with a metal gate conductor.

FIGS. 2A-2B illustrate a conventional MOS device with a poly-silicon gate conductor.

FIGS. 3A-3B illustrate a MOS device with a metal gate conductor, a cap layer, and a self-aligned contact structure, in accordance with one embodiment of the present invention.

FIGS. 4A-4B illustrate a MOS device with a metal gate conductor, a cap layer, and a self-aligned contact structure, in accordance with another embodiment of the present invention.

FIG. 5 illustrates a process flow for fabricating the above-mentioned MOS device, in accordance with one embodiment of the present invention.

DESCRIPTION

FIG. 1A illustrates a cross section of a conventional MOS device 100 on a semiconductor substrate 102. A method to successfully from at least one conductive plug adjacent to at least one metal gate conductor will be discussed in detail below. Shallow trench isolations (STIs) 104 first define an active area therebetween. A gate dielectric layer 106 is formed atop the substrate 102, and covered by a metal gate conductor 108. A low doped drain 110 is formed. The gate structure, which includes the gate dielectric layer 106 and the metal gate conductor 108, is covered on their sidewalls by spacers 112. Plus-doped source/drain regions 114 are formed. A salicide source/drain contact 116 is formed. An inter-level dielectric layer 118 is deposited over the metal gate conductor 108 and the sour/drain regions 114. A contact via is etched in the inter-level dielectric layer 118, down to the silicide layer 116, and then filled with a conductive material to form a conductive plug 120. A metal layer is then deposited and pattern-etched to form a metal interconnect 122. Electrical connection is made from the metal interconnect 122, through the plug 120, to the salicide source/drain contact 116.

FIG. 1B illustrates a cross section of a conventional MOS device 124, which is the same as the MOS device 100 in FIG. 1A, except that two conductive plugs 126 are misaligned. The conductive plug 126 on the left is in contact with the salicide source/drain contact 116, the sidewall spacers 112, and the top surface of the metal gate conductor 108. As a result, the salicide source/drain contact 116 and the metal gate conductor 108 are electrically connected. Due to this misalignment, the circuit will be shorted, thereby causing failure.

FIG. 2A illustrates a cross section of another conventional MOS device 200, which is proposed to solve the misalignment problem shown in FIG. 1B. A method to successfully form at least one conductive plug adjacent to at least one poly-silicon gate conductor will be discussed in detail below. STIs 204 first define an active area. A gate dielectric layer 206 is deposited on a semiconductor substrate 202, and covered by a poly-silicon gate conductor 208. A low doped drain 210 is formed on the substrate 202. The upper portion of the poly-silicon gate conductor 208 is alloyed with a metal to form a metal silicide layer 212. A cap layer 214, such as an oxide layer, is deposited on top of the metal silicide layer 212. The gate structure, composed of the poly-silicon gate conductor 208, the metal silicide layer 212 and the cap layer 214, is covered on their sidewalls by sidewall spacers 216. Plus-doped source/drain regions 218 are formed. A salicide source/drain contact 220 is also formed. An inter-level dielectric layer 222 is deposited over the gate structure and the source/drain regions 218. A via is etched in the inter-level dielectric layer 222, down to the salicide source/drain contact 220, and filled with a conductive material forming a conductive plug 224. A metal layer is then deposited and pattern-etched to form a metal interconnect 226. Electrical connection is made from the metal interconnect 226, through conductive plug 224, to the salicide source/drain contact 220.

FIG. 2B illustrates a cross section of a conventional MOS device 228, which is the same as the MOS device 200 in FIG. 2A, except that two conductive plugs 230 are misaligned. In such case, the cap layer 214 and the spacer 216 may be partially etched off in the process of forming the via for the conductive plug 230. The degree of etching of the cap layer 214 depends on the nature of the etchant and the particular material or materials in the cap layer 214. If the cap layer 214 is thick enough, the silicide layer can be protected from connection to the salicide source/drain contact 220 through the conductive plug 230.

From the process perspective, because of the cap layer 214, it is difficult to form the metal silicide layer 212 and the salicide source/drain contact 220 in the same set of process steps. If the metal silicide layer 212 and the salicide source/drain contact 220 were to be formed simultaneously, the spacers 216 must be formed before a blanket metal layer is deposited, in order to avoid an undesired connection formed therebetween. However, in the present case, the spacers 216 must be formed after the formation of the cap layer 214. Accordingly, the metal silicide layer 212 must be formed before the cap layer 214 and the spacers 216. This excludes the metal silicide layer 212 and the salicide source/drain contact layer 220 forming simultaneously. The salicide technology requires a series of process steps, such as metal deposition, thermal treatment, and etching. The conventional MOS devices, as shown in FIGS. 2A and 2B, necessitate repeating such salicide process steps twice. This significantly increases the fabrication overhead. While the cap layer 214 avoids the misalignment problem, it complicates the fabrication process and increases costs.

FIG. 3A illustrates a cross section of a MOS device 300 constructed on a semiconductor substrate 302, such as Si, SiGe, epi-Si and Ge, in accordance with the first embodiment of the present invention. STIs 304 define an active area, on which the MOS device 300 is formed. A gate dielectric layer 306 is formed on the substrate 302, and covered by a metal gate conductor 308. The metal gate conductor 308 has a thickness between 100 and 3,000 Angstroms. The material of the metal gate conductor 308 can be a refractory metal, nitrided metal, tungsten (W), aluminum (Al), aluminum/copper (AlCu), copper (Cu), copper content, metal silicide, titanium (Ti), titanium silicide ($TiSi_2$), cobalt (Co), cobalt silicide ($CoSi_2$), nickel (Ni), nickel silicide (NiSi), titanium nitride (TiN), titanium/tungsten (TiW), tantalum nitride (TaN), or a combination thereof. The gate dielectric layer 306 can be oxide, silicon oxide, silicon oxynitride (SiON), silicon nitride ($Si_3N_4$), tantalum oxide ($Ta_2O_5$), alumina (Al), hafnium oxide (HfO), plasma-enhanced chemical vapor deposition (PECVD) oxide, tetraethylorthosilicate (TEOS), nitrogen content oxide, nitrided oxide, hafnium content oxide, tantalum content oxide, aluminum content oxide, high K (K>5) material, or a combination thereof.

A low doped drain 310 is diffused. A cap layer 312, having a thickness between 50 and 3,000 Angstroms, is formed atop the metal gate conductor 308. Appropriate materials of the cap layer 312 include oxide, silicon oxynitride, silicon nitride, tantalum oxide, alumina, hafnium oxide, plasma enhanced chemical vapor deposition (PECVD) oxide, tetraethylorthosilicate (TEOS). Nitrogen content oxide, nitrided oxide, hafnium content oxide, tantalum content oxide, aluminum content oxide, high K (K>5) material, or a combination of two or more. In this embodiment, the cap layer 312 can be a single layer or multiple layers, such as, an oxide layer or a layer of oxide covered by a layer of silicon nitride, wherein the oxide layer has a thickness between 50 and 3,000 Angstroms, and the silicon nitride layer has a thickness between 50 and 2,000 Angstroms.

The gate stack, composed of the metal gate conductor 308 and the cap layer 312, is covered on their sidewalls by sidewall spacers 314. Appropriate materials of the side wall spacers 314 include oxide, silicon oxynitride, silicon nitride, low pressure TEOS (LPTEOS), high temperature oxide (HTO), furnace oxide, plasma-enhanced chemical enhanced deposition (PECVD) oxide, low pressure (LP) oxide, low K (K<3.1), hafnium content oxide, tantalum content oxide, aluminum content oxide, high K (K>5) material, oxygen content dielectric, nitrogen content dielectric, or a combination thereof. This dielectric sidewall spacer 314 serves as an isolation dielectric layer between the metal gate conductor 308 and an adjacent self-aligned contact 318 and a conductive plug 322.

A plus-doped source/drain regions 316 are formed on the substrate 302. A salicide source/drain contact 318 is then formed adjacent to the metal gate conductor 208 on the substrate 302. An inter-level dielectric layer 320, such as a silicon oxide layer, is deposited over the sour/drain regions 316, the spacers 314 and the cap layer 312. A contact via is etched through the inter-level dielectric layer 320, down to the salicide source/drain contact 318, and filled with a conductive material, forming a conductive plug 322. Appropriate conductive materials for the plug 322 include refractory metal, nitrided metal, tungsten, aluminum, aluminum/copper, copper, copper content, silicide, titanium, titanium silicide, cobalt, cobalt silicide, nickel, nickel silicide, titanium nitride, tantalum nitride, or a combination thereof. The conductive plug 322 and the salicide source/drain contact 318, together, are referred to as a self-aligned contact structure. The layout of the self-aligned contact structure can be square, rectangular, or long-for local interconnection, and can form a butted contact. It is understood by those skilled in the art that the conductive plug 322 can be adjacent to a gate structure, adjacent to the edge of an active region, or can cross the border between an active region and a field oxide region.

A metal layer is deposited and pattern-etched to form a metal interconnect 324 above the inter-level dielectric layer 320. Electrical connection is made from the metal interconnect 324, through the conductive plug 322, to the salicide source/drain contact 318.

The present invention avoids the dilemma of choosing between a salicide layer on the poly-silicon gate conductor and a self-aligned contact on the source/drain regions in the conventional art. In this embodiment, since the gate conductor 308 is made of metal, no salicide layer is needed for improving its interface quality with a metal interconnection structure. This naturally solves the dilemma by choosing to from the self-aligned contact 318 atop the source/drain regions 316, without sacrificing the contact quality of the metal gate conductor 308. In addition, by keeping the cap layer 312 atop the metal gate conductor 308, the MOS device 300 is able to tolerate a slight misalignment of the conductive plug 322. This feature will be explained below.

FIG. 3B illustrates a cross-section of a MOS device 326 that is the same as the MOS device 300 shown in FIG. 3A, except that two conductive plugs 328 are misaligned. The degree of etching of the cap layer 312 by the via etch depends on the preferential nature of the etchant and the particular material or materials in the cap layer 312. For example, the conductive plug 328 on the left is in contact with the salicide source/drain contact 318, the insulating sidewall spacer 314, and the top surface of the insulating cap layer 312 that is at the top of the gate stack. Electrical contact is, as intended, only made to the salicide source/drain contact 318, since the insulating cap layer 312 insulates the metal gate conductor 308 from being exposed. Thus, a slight misalignment of the conductive plug 328 can be tolerated.

FIG. 4A illustrates a cross section of a MOS device 400 constructed on a semiconductor substrate 402, in accordance with the second embodiment of the present invention. STIs 404 define an active area, on which the MOS device 400 can be formed. A gate dielectric layer 406 is covered by a laterally-recessed metal gate conductor 408 that forms an air void with sidewall spacers 414. As a design choice, the air void can be filled with a dielectric material, forming side liners 410, which substantially align with the sidewalls of a cap layer 412. This laterally-recessed metal gate structure further comprising the spacer formation step to fill the air void and form the spacer layer simultaneously. A low doped drain 411 is formed in a region that extends it to proximity beneath the edge of the metal gate conductor 408. The cap layer 412, typically oxide, is deposited on top of the metal gate conductor 408. The gate stack, composed of the metal gate conductor 408, the side liners 410 (or air voids) and the cap layer 412, is covered on their sidewalls by sidewall spacers 414. Plus-doped source/drain regions 416 are formed on the substrate 402. A salicide source/drain contact 418 is formed atop the source/drain regions 412. An inter-level dielectric layer 420 is deposited. A contact via is etched into the inter-level dielectric layer 420, down to the salicide source/drain contact 418, and filled with a conductive material, forming a conducive plug 422. A metal layer is deposited and pattern-etched to form a metal interconnect 424 on the inter-level dielectric layer 420. Electrical connection is made from the metal interconnect 424, through the conductive plug 422, to the salicide source/drain contact 418. In order to avoid repetition, the choices of design, such as the materials and dimensions of the component structures, are not described in detail here, since they are similar to those introduced by FIGS. 3A and 3B.

By using a metal gate conductor 408, this embodiment avoids the dilemma of choosing between a salicide layer on the poly-silicon gate conductor and a self-aligned contact on the source/drain regions in the conventional art. Furthermore, the cap layer 412 allows the MOS device 400 to tolerate a slight misalignment of the conductive plug 422, as it will be discussed below.

FIG. 4B illustrates a cross section of a MOS device 426 that is the same as the MOS device 400 shown in FIG. 4A, except that two conductive plugs 428 are misaligned. The degree of etching of the cap by the via etch depends on the preferential nature of the etchant and the particular material or materials in the cap. In this case, the conductive plug 428 on the left is in contact with the salicide source/drain contact 418, the insulating sidewall spacer 414, and the top surface of the cap layer 412 that is at the top of the gate stack. The conductive plug 428 and the salicide source/drain contact 418, together, are referred to as the self-aligned contact structure. Electrical contact is, as intended, only made to the salicide source/drain contact 418, since the insulating cap layer 412 and spacers 414 insulate the metal gate conductor 408 from being exposed. In addition, the side liners 410 (see FIG. 4A) also increase the isolation margin between the recessed metal gate conductor 408 and the conductive plug 428 that is etched in close proximity. This further adds to the safety margin provided by the sidewall spacer 414.

FIG. 5 presents a process flow 500 illustrating the process steps that will produce a MOS device with a combination of a metal gate conductor, and the self-aligned contact structure, in accordance with the first embodiment of the present invention. With reference to both FIGS. 3A and 5, in step 502, the active regions, or the complex areas between the shallow trench isolation (STI) regions 304, are defined for N-channel or P-channel MOS devices. In step 504, the channels, or the areas in the substrate 302 immediately beneath the gate dielectric 306, are doped appropriately. In step 506, the gate dielectric layer 306 is deposited. In step 508, the metal gate conductor 308 is deposited. In step 510, the cap layer 312 is deposited on the metal gate conductor 308. In step 512, a gate layer, which is composed of the metal gate conductor 308 and the cap layer 312, is patterned. In step 514, the low doped drain 310 is doped. In step 516, the sidewall spacers 314 are formed. In step 518, the salicide source/drain contact 318 is doped. In step 520, a contact etch stop layer, not shown, is deposited. In step 522, the inter-level dielectric layer 320 is deposited. In step 524, the inter-level dielectric layer 320 and the cap layer 312 are etched through, down to the metal gate conductor 308, forming a gate contact opening (not shown). In step 526, openings for the self-aligned contact structure are patterned and etched. In step 528, metallization is performed to from the contacts. In step 530, the metal interconnect 324 is formed.

Applications for the combination of metal gate conductor with self-aligned contact structure include dynamic random access memory (DRAM), static random access memory (SRAM), non-volatile memory cells, and volatile memory cells. Within these integrated circuits (ICs), a metal gate conductor on gate dielectric on semiconductor substrate generates a MOS transistor. This can be constructed as NMOS, PMOS, CMOS, SOI NMOS, SOI PMOS, SOI CMOS, NMOS FinFET, PMOS FinFET, CMOS FinFET, or a combination of two or more.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a gate structure for MOS devices, comprising:
    depositing a gate dielectric layer on a substrate;
    depositing a gate metal layer directly on the gate dielectric layer;
    depositing a cap layer directly on the gate metal layer, the bottom of the cap layer above the uppermost portion of the gate metal layer;
    patterning the cap layer, the gate metal layer and the gate dielectric layer to form a capped gate conductor;
    forming one or more spacers covering sidewalls of the capped gate conductor, including a stack of the patterned cap layer and gate metal layer;
    forming an inter-level dielectric layer over the capped gate conductor, the spacers and the substrate;
    forming a contact opening in the inter-level dielectric layer, exposing a portion of a top surface of the substrate adjacent to the spacers; and
    forming a contact structure within the contact opening, wherein the spacers and the cap layer separate the contact structure from the patterned gate metal layer enclosed therein.

2. The method of claim 1 wherein the gate metal layer has a constant thickness, said thickness being between 100 and 3,000 Angstroms.

3. The method of claim 1 wherein the gate metal layer is made of a material including W, Al, AlCu, Cu, Ti, TiSi2, Co, CoSi2, Ni, NiSi, TiN, TiW, or TaN.

4. The method of claim 1 wherein the cap layer has a thickness between 50 and 3,000 Angstroms.

5. The method of claim 1 wherein depositing a cap layer further comprises:
    forming a first cap sub-layer atop the gate metal layer; and
    forming a second cap sub-layer atop the first cap sub-layer.

6. The method of claim 1 further comprising forming a gate opening through the cap layer to expose a part of the patterned gate metal layer, before the forming an inter-level dielectric layer.

7. The method of claim 1 wherein the gate metal layer is a single material layer.

8. The method of claim 2 wherein the gate metal layer is made of a material including refractory metal, nitrided metal, or silicide.

9. The method of claim 5 wherein the first cap sub-layer has a thickness between 50 and 3,000 Angstroms.

10. The method of claim 7 wherein the single material layer has opposed essentially flat upper and lower surfaces.

11. The method of claim 9 wherein the second cap sub-layer has a thickness between 50 and 2,000 Angstroms.

12. The method of claim 11 wherein the first cap sub-layer is an oxide layer and the second cap sub-layer is a nitride layer.

13. A method for forming a gate structure for MOS devices, comprising:
    depositing a gate dielectric layer on a substrate;
    depositing a gate metal layer atop the gate dielectric layer;
    depositing a cap layer atop the gate metal layer by forming a first cap sub-layer atop the gate metal layer and forming a second cap sub-layer atop the first cap sub-layer;
    patterning the cap layer, the gate metal layer and the gate dielectric layer to form a capped gate conductor;
    forming one or more spacers covering sidewalls of the capped gate conductor, including a stack of the patterned cap layer and gate metal layer;
    forming an inter-level dielectric layer over the capped gate conductor, the spacers and the substrate;
    forming a contact opening in the inter-level dielectric layer, exposing a portion of a top surface of the substrate adjacent to the spacers; and
    forming a contact structure within the contact opening, wherein the spacers and the cap layer separate the contact structure from the patterned gate metal layer enclosed therein.

14. A method for forming a gate structure for MOS devices, comprising:
    depositing a gate dielectric layer on a substrate;
    depositing a single gate metal layer directly on the gate dielectric layer;
    depositing a cap layer atop the gate metal layer;
    patterning the cap layer, the gate metal layer and the gate dielectric layer to form a capped gate conductor having opposed sidewalls comprising respective edges of the gate dielectric layer, the single gate metal layer and the cap layer;
    forming one or more spacers covering the sidewalls of the capped gate conductor;
    forming an inter-level dielectric layer over the capped gate conductor, the spacers and the substrate;
    forming a contact opening in the inter-level dielectric layer, exposing a portion of a top surface of the substrate adjacent to the spacers; and
    forming a contact structure within the contact opening, wherein the spacers and the cap layer separate the contact structure from the patterned gate metal layer enclosed therein.

* * * * *